(12) United States Patent
Secareanu et al.

(10) Patent No.: US 11,462,493 B2
(45) Date of Patent: Oct. 4, 2022

(54) METHOD AND SYSTEM FOR IMPROVED NOISE ISOLATION IN AN ELECTROSTATIC DISCHARGE PROTECTION SCHEME

(71) Applicant: NXP USA, Inc., Austin, TX (US)

(72) Inventors: Radu Mircea Secareanu, Phoenix, AZ (US); Michael A. Stockinger, Austin, TX (US)

(73) Assignee: NXP USA, INC., Austin, TX (US)

( * ) Notice: Subject to any disclaimer, the term of this patent is extended or adjusted under 35 U.S.C. 154(b) by 224 days.

(21) Appl. No.: 16/906,975

(22) Filed: Jun. 19, 2020

(65) Prior Publication Data

US 2021/0398920 A1    Dec. 23, 2021

(51) Int. Cl.
  *H01L 23/60*  (2006.01)
  *H01L 27/02*  (2006.01)
  *H02H 9/04*   (2006.01)

(52) U.S. Cl.
  CPC .......... *H01L 23/60* (2013.01); *H01L 27/0255* (2013.01); *H01L 27/0262* (2013.01); *H01L 27/0266* (2013.01); *H02H 9/046* (2013.01)

(58) Field of Classification Search
  CPC ....... H01L 23/60; H01L 27/0248–0296; H01L 23/12–26
  See application file for complete search history.

(56) References Cited

U.S. PATENT DOCUMENTS 6,756,834 B1   6/2004  Tong et al.
7,687,858 B2   3/2010  Woo et al.

OTHER PUBLICATIONS

Ming-Dou Ker etal., "ESD Protection Design to Overcome Internal Damage on Interface Circuits of a CMOS IC with Multiple Separated Power Pins," IEEE Transactions on Components and Packaging Technologies, v.27, n.3 (2004).

*Primary Examiner* — Amar Movva

(57) ABSTRACT

An electrostatic discharge (ESD) protection scheme is provided that reduces EMI noise propagation among functional circuit blocks of an integrated circuit (IC). Traditional ESD protection schemes include an ESD bus electrically tied to the substrate of an integrated circuit (e.g., a P-well) and substrate well regions associated with electromagnetic interference (EMI) aggressor and sensitive circuits. These electrical couplings can propagate EMI noise on the ESD bus throughout the circuit blocks of the IC. Embodiments provide an ESD bus that is not tied to the substrate well regions associated with EMI aggressor and sensitive circuits of the IC, but instead is a separate conductive layer electrically coupled to an external ground. In this manner, the device circuits are isolated from EMI noise carried in the ESD bus, thereby protecting the various functional blocks from such noise.

20 Claims, 3 Drawing Sheets

METHOD AND SYSTEM FOR IMPROVED NOISE ISOLATION IN AN ELECTROSTATIC DISCHARGE PROTECTION SCHEME

BACKGROUND

Field

This disclosure relates generally to integrated circuits, and more specifically, to an on-chip electrostatic discharge protection scheme that improves electromagnetic interference isolation between functional components of an integrated circuit.

Related Art

Today's market for consumer devices and automotive systems requires electronic devices that can process and communicate significant quantities of information using a variety of protocols and media (e.g., vehicle-to-vehicle networking, Internet of Things, advanced driver alert systems, and other wireless products). Integrated circuits incorporated in these devices are designed to execute a diverse set of functionalities, including, for example, radio frequency (RF), digital, mixed-signal, and high-precision analog. In order to accurately provide such functionality in a single integrated circuit (IC), minimal electromagnetic interference (EMI) between functional blocks is necessary.

In addition, compliance with electrostatic discharge (ESD) protection requirements is a necessity for most products. But ESD protection on-chip solutions can result in increases of EMI propagation and such contradictions in goals are often difficult to resolve. Traditional methods for providing ESD protection and noise isolation have therefore resulted in compromises that are less optimal in today's higher frequency, smaller dimension integrated circuits.

BRIEF DESCRIPTION OF THE DRAWINGS

Embodiments of the present invention may be better understood by referencing the accompanying drawings.

The use of the same reference symbols in different drawings indicates identical items unless otherwise noted. The figures are not necessarily drawn to scale.

DETAILED DESCRIPTION

Embodiments of the present invention provide an electrostatic discharge (ESD) protection scheme that reduces EMI noise propagation among functional circuit blocks of an integrated circuit (IC). Traditional ESD protection schemes provide an ESD bus electrically tied to the substrate of an integrated circuit (e.g., a P-well) and substrate well regions associated with electromagnetic interference (EMI) aggressor and sensitive circuits. These electrical couplings can propagate EMI noise on the ESD bus throughout the circuit blocks of the IC. Embodiments provide an ESD bus that is not tied to the substrate well regions associated with EMI aggressor and sensitive circuits of the IC, but instead is a separate conductive layer electrically coupled to an external ground. In this manner, the device circuits are isolated from EMI noise carried in the ESD bus, thereby protecting the various functional blocks from such noise.

Figure 1:
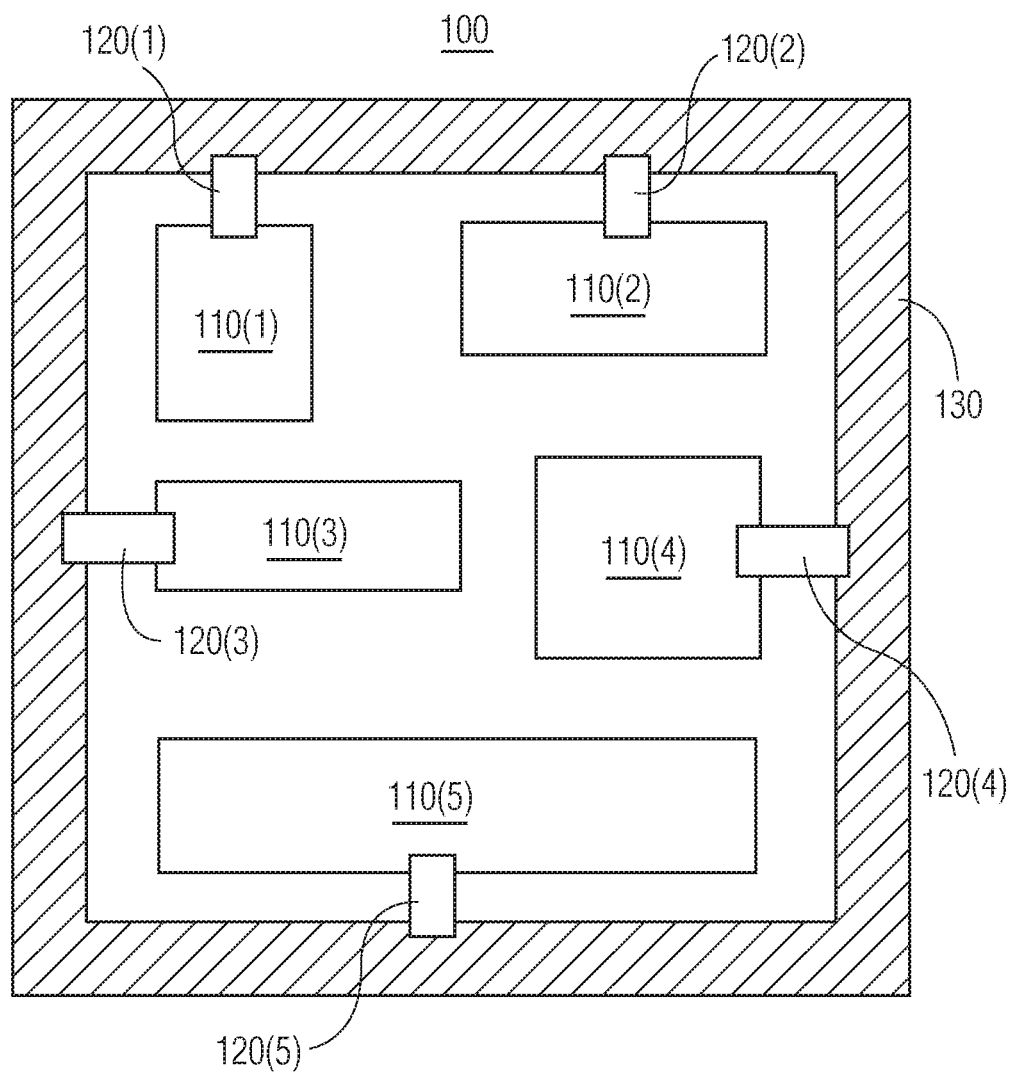
FIG. 1 is a simplified block diagram illustrating a typical scheme for implementing ESD protection in an integrated circuit.

FIG. 1 is a simplified block diagram illustrating a typical scheme for implementing ESD protection in an integrated circuit. Integrated circuit 100 includes a set of circuit blocks 110(1)-(5). Each circuit block is coupled to an ESD bus 130 via a corresponding back-to-back diode pair 120(1)-(5). In the illustrated scheme, the ESD bus structure also serves as an edge seal of integrated circuit 100.

The edge seal is a stress protection structure around integrated circuits that protects the circuits inside semiconductor chips from damage caused by the sawing of the semiconductor chips from wafers. In addition, the edge seal can protect the circuitry of the IC from contaminating ions that affect yield during processing and affect performance of the IC after fabrication. Typical edge seals are formed of interconnected metal layers, dielectric layers between the metal layers, and connecting vias electrically coupling the metal layers ultimately to a $P^+$ region encircling the integrated circuit chip. The P+ region grounds the edge seal, and hence the ESD bus, to the substrate of the chip (i.e., the VSS_bulk region).

In a mixed-signal/RF product that is subject to noise isolation requirements, there can be several independent power/ground domains. As illustrated in FIG. 1, the independent power/ground domains are associated with circuit blocks having specific functionalities (e.g., 110(1)-(5)). Some circuit functions can be considered a noise generator or aggressor (e.g., high speed circuits, noisy digital circuits, RF transmitters) or a noise receptor or sensitive (e.g., RF receivers, analog circuits). In addition, there can be several substrate ("SUB") domains, which can be implemented as $P^+$ rings surrounding an aggressor or sensitive functional block. ESD protection schemes often require that these various power/ground domains be coupled to the ESD bus using back-to-back diodes. In some applications, the ESD bus is also coupled to one or more of the SUB domains.

In a traditional ESD protection scheme, where the ESD bus structure also functions as the IC edge seal, the ESD bus is thereby electrically coupled to the P+ region of the substrate on which the integrated circuit is formed. The functional circuit blocks transmit noise into the ESD bus. This EMI noise is exhibited in spectra that depends upon the functions of the various circuit blocks. In some instances, the spectra can be aggressive in terms of noise content (e.g., originating from a digital circuit block having a wide-spectra noise). Once reaching the ESD bus, the EMI noise can propagate throughout the entire chip substrate via the edge seal coupling to the VSS_bulk voltage region of the substrate. Further, the noise can propagate to the core of a chip (e.g., a sea of gates region) should the edge seal couple to SUB domains. This EMI noise propagation can adversely affect the functioning of the integrated circuit.

In order to reduce the noise propagation exhibited by traditional IC devices, embodiments utilize an ESD protection scheme having a dedicated ESD bus that does not provide an electrical coupling to the VSS_bulk region of the substrate. Embodiments provide an edge seal that is independent from the ESD bus and can be handled in the same manner as other SUB domains.

Figure 2:
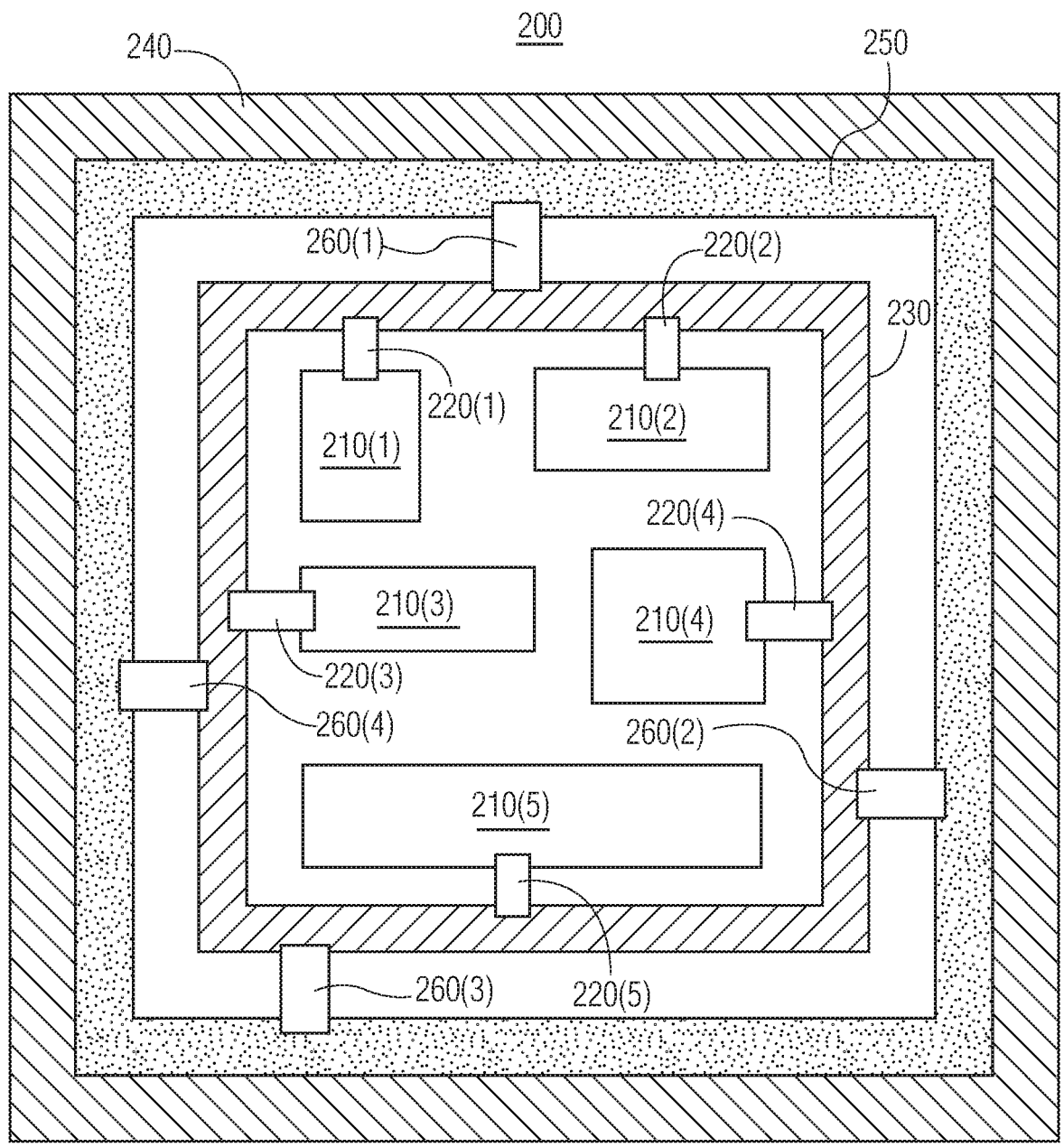
FIG. 2 is a simplified block diagram illustrating an ESD protection scheme for an integrated circuit device in accord with embodiments of the present invention.

FIG. 2 is a simplified block diagram illustrating an ESD protection scheme for an integrated circuit device 200 in accord with embodiments of the present invention. Integrated circuit 200 includes a set of circuit blocks 210(1)-(5).

Each circuit block has an independent power/ground domain. The circuit blocks are coupled to an ESD bus 230 via corresponding bidirectional ESD protection elements 220(1)-(5). In some embodiments, the bidirectional ESD protection elements are back-to-back diode pairs. In other embodiments, the bidirectional ESD protection elements can take the form of stacked back-to-back diodes (e.g., four or more diodes in the protection element), an active MOSFET clamping device, a snapback device (e.g., a bipolar junction transistor or a silicon controlled rectifier), and the like. In some of the discussion below, a back-to-back diode pair may be provided as an example of the bidirectional ESD protection element, but embodiments of the present invention are not limited to use of back-to-back diode pairs for this purpose.

In the ESD protection scheme of FIG. 2, ESD bus 230 is distinct from edge seal ring 240. In certain embodiments, the ESD bus is a metal layer structure that does not communicate with the $P^+$ region of the integrated circuit substrate (i.e., the VSS_bulk region). Instead, the ESD bus is coupled to ground using one or more external pads of the integrated circuit chip input/output ring. In addition, the ESD bus also is electrically isolated from the substrate well regions associated with each circuit domain that comprises an EMI aggressor circuit or an EMI sensitive circuit. FIG. 2 further illustrates an I/O ring 250. I/O ring 250 is in an independent power/ground domain (e.g., the VSS_bulk power domain along with the edge seal) and is therefore coupled to ESD bus 230 via bidirectional ESD protection elements 260(1)-(4).

While ESD bus 230 and edge seal 240 are illustrated as being physically separate from one another, in some embodiments, in order to conserve area of the chip, the ESD bus and edge seal can be formed one over the other or otherwise very close to one another. It should be noted however, that should the ESD bus and edge seal structures be formed one over the other, capacitive coupling between the structures can result, which may introduce some of the noise transmitted to the ESD bus to the VSS_bulk region via the edge seal. Thus, it is preferable to locate the ESD bus in a region of the IC that minimizes the capacitive coupling with the edge seal structure.

In certain embodiments, ESD bus 230 is formed from a metal layer provided on the integrated circuit. Use of this separate bus metal provides improved noise isolation between the various power/ground domains over previous ESD protection schemes. Further, ESD bus 230 can be formed from a metal narrower than, for example, a main power rail of an ESD clamp network. This is due to the ESD bus needing only to conduct ESD current from different circuit domains (e.g., due to interconnect failure limits), and therefore the ESD bus resistance does not directly impact ESD clamping performance, as compared with VSS resistance in a distributed ESD rail clamp scheme. Use of the narrower metal lines for the ESD bus conserves chip area for the circuit blocks and interconnects.

Figure 3:
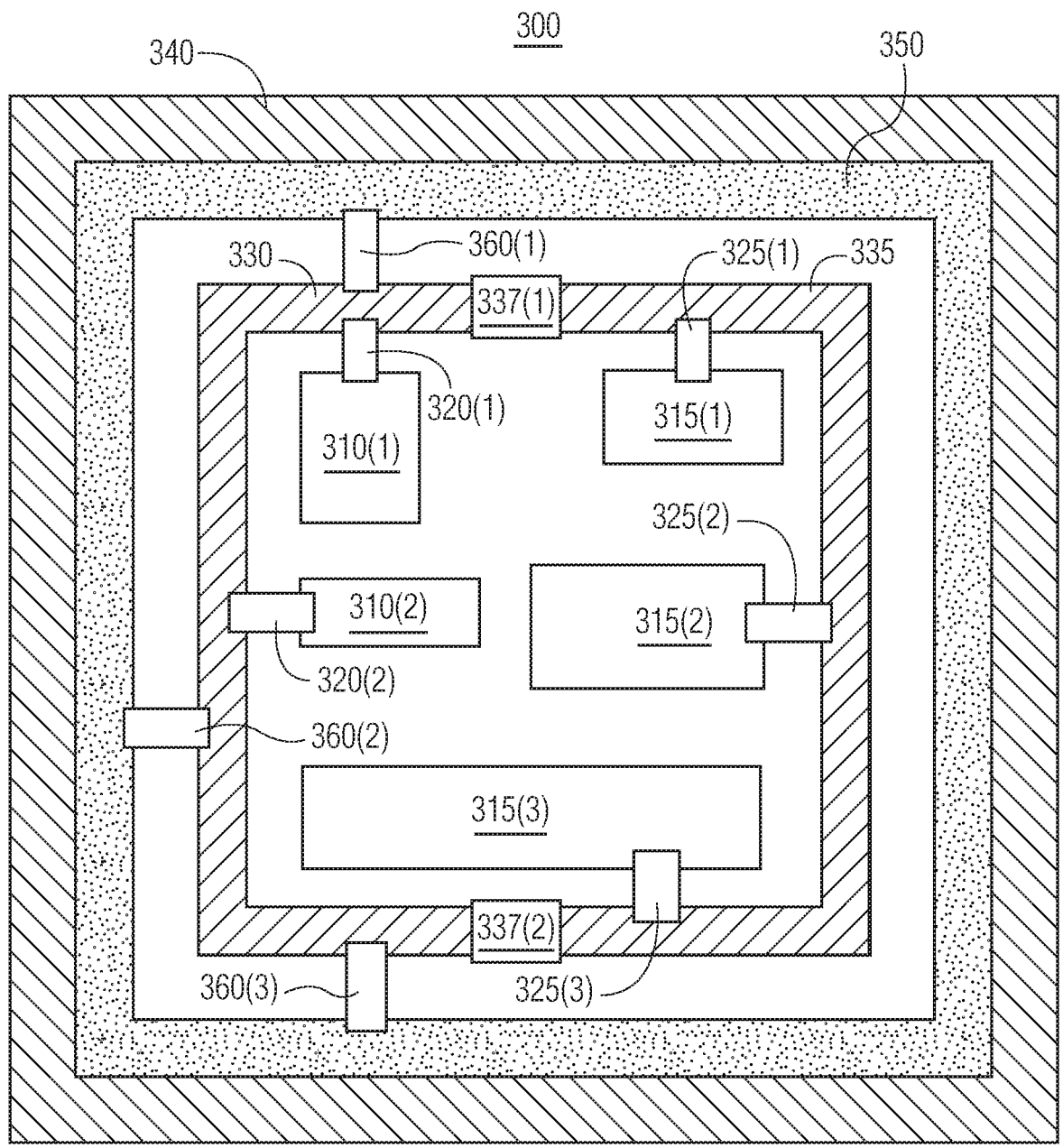
FIG. 3 is a simplified block diagram illustrating an alternative ESD protection scheme for an integrated circuit device, in accord with certain embodiments.

FIG. 3 is a simplified block diagram illustrating an alternative ESD protection scheme for an integrated circuit device 300, in accord with certain embodiments. Integrated circuit 300 includes two sets of circuit blocks. Circuit blocks 310(1)-(2) are noise aggressor functional domains, while circuit blocks 315(1)-(3) are noise sensitive functional domains. In the embodiment of FIG. 2, all circuit blocks—noise aggressor, noise sensitive, and SUB domains—share the same ESD bus. In such a structure, the common metal ESD bus can provide a coupling path. Noise communication provided by the ESD bus may be negligible for most applications. But due to the inclusion of junction capacitance from the sets of back-to-back diodes in the coupling path, in some highly sensitive or high frequency applications (e.g., radar), the noise propagation may impact the application. FIG. 3 provides an ESD bus structure that addresses this noise propagation.

In FIG. 3, the ESD bus is divided into two sections. ESD bus section 330 is coupled to noise aggressor functional domains 310(1) and 310(2) via bidirectional ESD protection elements 320(1) and 320(2), respectively. ESD bus section 335 is coupled to noise sensitive functional domains 315(1)-(3) via corresponding back-to-back diode pairs 325(1)-(3). Each ESD bus section is coupled to an external ground using one or more grounding pads (not shown). The two ESD bus sections are coupled through two bidirectional ESD protection elements 337(1) and 337(2). By separating the ESD bus in this manner, the coupling between noise aggressor and noise sensitive functional domains is reduced even further over the embodiment illustrated in FIG. 2. The embodiment illustrated in FIG. 3 can be applicable particularly for very high frequency integrated circuit implementations.

As with the ESD protection scheme of FIG. 2, ESD busses 330 and 335 are distinct from edge seal ring 340. FIG. 3 also provides an I/O ring 350. I/O ring 350 is in an independent power/ground domain (e.g., the VSS_bulk power domain) and is therefore coupled to ESD bus 330 via bidirectional ESD protection elements 360(1)-(3). By coupling the I/O ring to the ESD bus serving the noise aggressor functional blocks, a further reduction in noise signals applied to the VSS_bulk region of the IC is achieved.

Embodiments of the present invention provide a mechanism to reduce propagation of EMI noise throughout an integrated circuit chip. This reduction in propagation is provided by electrically isolating the electrostatic discharge bus from paths to the substrate well regions associated with each circuit domain including an EMI aggressor circuit or EMI sensitive circuit and the VSS_bulk power domain in the P-wells of the substrate of the chip. Certain embodiments provide further noise propagation reduction by dividing the ESD bus into components associated with noise aggressors and noise sensitives. In so doing, performance and reliability of integrated circuits susceptible to noise generation is improved.

The semiconductor substrate described herein can be any semiconductor material or combinations of materials, such as gallium arsenide, silicon germanium, silicon-on-insulator (SOI), silicon, monocrystalline silicon, the like, and combinations of the above. Conductive lines, such as ESD bus 230, 330, or 335, can be formed from any conductive material, such as but not limited to doped amorphous silicon, doped polysilicon, aluminum, copper, tantalum, titanium, tungsten, or any metal alloy, nitride or silicide thereof or any material to be made conductive by subsequent implantations of dopants, such as undoped polysilicon, for example.

Integrated circuits 200 and 300 may be singulated from a semiconductor wafer, which can be any semiconductor material or combinations of materials, such as gallium arsenide, silicon germanium, silicon-on-insulator (SOI), silicon, monocrystalline silicon, the like, and combinations of the above. Such an integrated circuit die includes active circuitry, which may include integrated circuit components that are active when the die is powered. The active circuitry is formed on the semiconductor wafer using a sequence of numerous process steps applied to semiconductor wafer, including but not limited to depositing semiconductor materials including dielectric materials and metals, such as growing, oxidizing, sputtering, and conformal depositing, etching semiconductor materials, such as using a wet etchant or a dry etchant, planarizing semiconductor materials, such as performing chemical mechanical polishing or planarization, performing photolithography for patterning, including depositing and removing photolithography masks or other photoresist materials, ion implantation, annealing, and the like. In some embodiments, the active circuitry may be a combination of integrated circuit components or may be another type of microelectronic device. Examples of integrated circuit components include but are not limited to a processor, memory, logic, oscillator, analog circuitry, sensor, MEMS (microelectromechanical systems) device, a stand-alone discrete device such as a resistor, inductor, capacitor, diode, power transistor, and the like.

As discussed above, integrated circuits 200 and 300 incorporate an edge seal disposed around the perimeter of the IC substrate. Edge seals are typically disposed within about 10 microns from a cutting line between ICs formed on a semiconductor wafer. An edge seal protects the integrated circuit against contamination during and after processing. The edge seal can contain various conductive layers formed on a high impedance substrate. The conductive layers include vias that are disposed within insulating layers to couple the various conductive layers. The conductive layers are typically formed from a metal such as aluminum, copper, tungsten, gold, silver, platinum, or titanium, or a conductive material such as indium tin oxide or indium zinc oxide. Edge seals can be formed from a variety of numbers of conductive layers and insulating layers. Insulating layers of the edge seal can be formed from materials such as $SiO_x$ and $SiN_x$, or other dielectrics. Conductive layers and insulating layers of the edge seal can be formed as single layers or multilayer structures.

It is noted that in some embodiments, the active circuitry of integrated circuits 200 and 300 may include a radio frequency (RF) block that implements an RF transmitter, an RF receiver, or both. In some embodiments, RF signals may be transmitted, received, or both, via an antenna on the resulting device that is communicatively coupled to the active circuitry of integrated circuits 200 and 300. The RF block may implement front end components of the RF transmitter, RF receiver, or both, where the front end components may include but are not limited to a transmitter power amplifier, a receiver low noise amplifier, one or more baluns, one or more filters, a circulator or other coupling device to the antenna, impedance matching elements, an oscillator, a phase locked loop, and other appropriate front end elements. The front-end components of the RF block may have configurable settings to adjust the transmit signal or receive signal. In some embodiments, the RF block may have an operating frequency that falls within a frequency band of 300 to 500 MHz, although other operating frequencies that fall within other radio frequencies may be implemented in other embodiments.

By now it should be appreciated that there has been provided an integrated circuit that includes a plurality of circuit domains and an electrostatic discharge (ESD) bus coupled to the plurality of circuit domains using a bidirectional ESD protection element for each circuit domain. Each circuit domain includes an associated power domain. The ESD bus includes a conductive structure electrically isolated from substrate well regions associated with each circuit domain including an EMI aggressor circuit or an EMI sensitive circuit. The ESD bus conductive structure is electrically isolated from the bulk layer of the substrate of the IC. The ESD bus is electrically coupled to a ground voltage external to the IC.

One aspect of the above embodiment further includes an edge seal ring along a perimeter of the integrated circuit where the ESD bus is a distinct structure from the edge seal ring. In a further aspect, the ESD bus is located such that capacitive coupling between the ESD bus and the edge seal ring is minimized. In another further aspect, the edge seal ring is electrically coupled to the bulk layer of the substrate of the integrated circuit. In still another further aspect, the edge seal ring is coupled to the ESD bus using a bidirectional ESD protection element.

Another aspect of the above embodiment further includes an external connector electrically coupling the ESD bus to the external ground voltage. In another aspect of the above embodiment, the plurality of circuit domains includes a set of EMI sensitive circuit domains and a set of EMI aggressor circuit domains. The ESD bus includes: a first sub-ESD bus coupled to the set of noise sensitive circuit domains using the corresponding bidirectional ESD protection elements, and a second sub-ESD bus coupled to the set of noise generating circuit domains using the corresponding bidirectional ESD protection elements. The first and second sub-ESD buses include separate conductive structures electrically isolated from substrate well regions associated with each circuit domain including an EMI aggressor circuit or an EMI sensitive circuit and electrically isolated from the bulk layer of the substrate of the IC. In a further aspect, the first sub-ESD bus is coupled to the second sub-ESD bus using a bidirectional ESD protection element.

Another aspect of the above embodiment further includes an input/output ring including one or more communication pads for the integrated circuit where the I/O ring is formed concentric to, and within, the edge seal ring. In a further aspect, the I/O ring is coupled to the ESD bus using a bidirectional ESD protection element. In yet another aspect of the above embodiment, the bidirectional ESD protection element includes one of a back-to-back diode pair, stacked back-to-back diodes, and active MOSFET clamping device, and a snapback device.

In another embodiment, an integrated circuit is provided that includes: an ESD bus including a conductive structure electrically isolated from substrate well regions associated with each EMI aggressor circuit and each EMI sensitive circuit of the IC; a connector configured to electrically couple the ESD bus to ground voltage external to the IC; a bidirectional ESD protection element corresponding to an EMI aggressor circuit and a bidirectional ESD protection element corresponding to an EMI sensitive circuit where each bidirectional ESD protection element couples the corresponding circuit to the ESD bus; and an edge seal ring formed on a perimeter of the IC. The edge seal ring is a distinct structure from the ESD bus. The edge seal ring is electrically coupled to the bulk layer of the substrate of the IC.

One aspect of the above embodiment further includes one or more bidirectional ESD protection elements coupling the ESD bus to the edge seal ring. Another aspect of the above embodiment further includes one or more power domains, formed on the IC, and each power domain coupled to the ESD bus using a corresponding bidirectional ESD protection element. In a further aspect, the one or more power domains includes one or more substrate domains. In another further aspect, the one or more power domains include the EMI aggressor circuit and the EMI sensitive circuit. In a still further aspect, the ESD bus includes: a first conductive structure electrically isolated from the substrate well regions associated with each EMI aggressor circuit and each EMI sensitive circuit of the IC and coupled to the EMI sensitive circuit using the bidirectional ESD protection element; and a second conductive structure electrically isolated from the substrate well regions associated with each EMI aggressor circuit and each EMI sensitive circuit of the IC and coupled to the EMI aggressor circuit using the bidirectional ESD protection element. In still a further aspect, the first conductive structure is coupled to the second conductive structure using a bidirectional ESD protection element.

In another aspect of the above embodiment, the ESD bus conductive structure includes a portion of a metal layer of the IC. In still another aspect of the above embodiment, the bidirectional ESD protection element includes one of a back-to-back diode pair, stacked back-to-back diodes, and active MOSFET clamping device, and a snapback device.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention has been described with respect to specific conductivity types or polarity of potentials, skilled artisans appreciated that conductivity types and polarities of potentials may be reversed.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. An integrated circuit (IC) comprising:
    a plurality of circuit domains, wherein each circuit domain comprises an associated power domain; and
    an electrostatic discharge (ESD) bus coupled to the plurality of circuit domains using a bidirectional ESD protection element for each circuit domain, wherein
        the ESD bus comprises a conductive structure electrically isolated from substrate well regions associated with each circuit domain comprising an electromagnetic interference (EMI) aggressor circuit or an EMI sensitive circuit,
        the ESD bus conductive structure is electrically isolated from the bulk layer of the substrate of the IC, and
        the ESD bus is electrically coupled to a ground voltage external to the IC.

2. The integrated circuit of claim 1 further comprising:
    an edge seal ring along a perimeter of the integrated circuit, wherein the ESD bus is a distinct structure from the edge seal ring.

3. The integrated circuit of claim 2 wherein the ESD bus is located such that capacitive coupling between the ESD bus and the edge seal ring is minimized.

4. The integrated circuit of claim 2 wherein the edge seal ring is electrically coupled to the bulk layer of the substrate of the integrated circuit.

5. The integrated circuit of claim 2 wherein the edge seal ring is coupled to the ESD bus using a bidirectional ESD protection element.

6. The integrated circuit of claim 1 further comprising:
    an external connector electrically coupling the ESD bus to the external ground voltage.

7. The integrated circuit of claim 1, wherein
    the plurality of circuit domains comprises
        a set of EMI sensitive circuit domains, and
        a set of EMI aggressor circuit domains; and
    the ESD bus comprises
        a first sub-ESD bus coupled to the set of noise sensitive circuit domains using the corresponding bidirectional ESD protection elements,
        a second sub-ESD bus coupled to the set of noise generating circuit domains using the corresponding bidirectional ESD protection elements, and
        the first and second sub-ESD buses comprise separate conductive structures electrically isolated from substrate well regions associated with each circuit domain comprising an EMI aggressor circuit or an EMI sensitive circuit and electrically isolated from the bulk layer of the substrate of the IC.

8. The integrated circuit of claim 7, wherein
    the first sub-ESD bus is coupled to the second sub-ESD bus using a bidirectional ESD protection element.

9. The integrated circuit of claim 1 further comprising:
    an input/output (I/O) ring comprising one or more communication pads for the integrated circuit, wherein the I/O ring is formed concentric to, and within, the edge seal ring.

10. The integrated circuit of claim 9 wherein the I/O ring is coupled to the ESD bus using a bidirectional ESD protection element.

11. The integrated circuit of claim 1 wherein the bidirectional ESD protection element comprises one of
    a back-to-back diode pair;
    stacked back-to-back diodes;

an active MOSFET clamping device; and
a snapback device.

12. An integrated circuit (IC) comprising:
an electrostatic discharge (ESD) bus comprising a conductive structure electrically isolated from substrate well regions associated with each electromagnetic interference (EMI) aggressor circuit and each EMI sensitive circuit of the IC;
a connector configured to electrically couple the ESD bus to ground voltage external to the IC;
a bidirectional ESD protection element corresponding to an EMI aggressor circuit and a bidirectional ESD protection element corresponding to an EMI sensitive circuit, wherein each bidirectional ESD protection element couples the corresponding circuit to the ESD bus; and
an edge seal ring formed on a perimeter of the IC, wherein
the edge seal ring is a distinct structure from the ESD bus, and
the edge seal ring is electrically coupled to the bulk layer of the substrate of the IC.

13. The integrated circuit of claim 12 further comprising:
one or more bidirectional ESD protection elements coupling the ESD bus to the edge seal ring.

14. The integrated circuit of claim 12 further comprising:
one or more power domains, formed on the IC, and each coupled to the ESD bus using a corresponding bidirectional ESD protection element.

15. The integrated circuit of claim 14 wherein the one or more power domains comprises one or more substrate domains.

16. The integrated circuit of claim 14 wherein the one or more power domains comprise:
the EMI aggressor circuit; and
the EMI sensitive circuit.

17. The integrated circuit of claim 16 wherein the ESD bus comprises:
a first conductive structure electrically isolated from the substrate well regions associated with each EMI aggressor circuit and each EMI sensitive circuit of the IC and coupled to the EMI sensitive circuit using the bidirectional ESD protection element; and
a second conductive structure electrically isolated from the substrate well regions associated with each EMI aggressor circuit and each EMI sensitive circuit of the IC and coupled to the EMI aggressor circuit using the bidirectional ESD protection element.

18. The integrated circuit of claim 17 wherein the first conductive structure is coupled to the second conductive structure using a bidirectional ESD protection element.

19. The integrated circuit of claim 12 wherein the ESD bus conductive structure comprises a portion of a metal layer of the IC.

20. The integrated circuit of claim 12 wherein the bidirectional ESD protection element comprises one of
a back-to-back diode pair;
stacked back-to-back diodes;
an active MOSFET clamping device; and
a snapback device.

* * * * *